US012740095B2

(12) United States Patent
Takaya

(10) Patent No.: US 12,740,095 B2
(45) Date of Patent: Sep. 15, 2026

(54) FIELD EFFECT TRANSISTOR

(71) Applicant: DENSO CORPORATION, Kariya-City (JP)

(72) Inventor: Hidefumi Takaya, Kariya-City (JP)

(73) Assignee: DENSO CORPORATION, Kariya-city (JP)

( * ) Notice: Subject to any disclaimer, the term of this patent is extended or adjusted under 35 U.S.C. 154(b) by 416 days.

(21) Appl. No.: 18/358,992

(22) Filed: Jul. 26, 2023

(65) Prior Publication Data

US 2023/0369484 A1 Nov. 16, 2023

Related U.S. Application Data

(63) Continuation of application No. PCT/JP2021/037474, filed on Oct. 8, 2021.

(30) Foreign Application Priority Data

Mar. 11, 2021 (JP) ................................ 2021-039305

(51) Int. Cl.
*H10D 30/66* (2025.01)

(52) U.S. Cl.
CPC ......... *H10D 30/665* (2025.01); *H10D 30/668* (2025.01)

(58) Field of Classification Search
CPC .. H10D 30/668; H10D 62/393; H10D 62/111; H10D 62/107
See application file for complete search history.

(56) References Cited

U.S. PATENT DOCUMENTS

| | | | | |
|---|---|---|---|---|
| 10,056,374 B2 * | 8/2018 | Saito | H10D 12/411 |
| 11,437,508 B2 * | 9/2022 | Kobayashi | H10D 62/153 |
| 2009/0200559 A1 | 8/2009 | Suzuki et al. | |
| 2012/0319136 A1 * | 12/2012 | Noborio | H10D 12/038 257/77 |
| 2014/0175459 A1 * | 6/2014 | Yamamoto | H10D 62/051 257/77 |
| 2019/0058061 A1 * | 2/2019 | Saito | H10D 30/668 |

* cited by examiner

*Primary Examiner* — Samuel A Gebremariam
*Assistant Examiner* — Jonas T Beardsley
(74) *Attorney, Agent, or Firm* — Posz Law Group, PLC

(57) ABSTRACT

A field effect transistor includes a plurality of p-type deep layers. The p-type deep layers protrude downward from a body layer, extend so as to intersect a trench when a semiconductor substrate is viewed from above, and extend from the body layer to a position below a bottom surface of the trench. Each of the p-type deep layers includes a low concentration region and a high concentration region having a higher p-type impurity concentration than the low concentration region and the body layer. The low concentration region is in contact with the body layer from below, and is in contact with the gate insulating film on a side surface of the trench located below the body layer. The high concentration region is in contact with the low concentration region from below.

3 Claims, 7 Drawing Sheets

FIELD EFFECT TRANSISTOR

CROSS REFERENCE TO RELATED APPLICATIONS

The present application is a continuation application of International Patent Application No. PCT/JP2021/037474 filed on Oct. 8, 2021, which designated the U.S. and claims the benefit of priority from Japanese Patent Application No. 2021-039305 filed on Mar. 11, 2021. The entire disclosures of all of the above applications are incorporated herein by reference.

TECHNICAL FIELD

The present disclosure relates to a field effect transistor.

BACKGROUND

There has been known a trench gate type field effect transistor having a plurality of p-type deep layers protruding downward from a body layer.

SUMMARY

The present disclosure provides a field effect transistor including a plurality of p-type deep layers. The p-type deep layers protrude downward from a body layer, extend so as to intersect a trench when a semiconductor substrate is viewed from above, and extend from the body layer to a position below a bottom surface of the trench. Each of the p-type deep layers includes a low concentration region and a high concentration region having a higher p-type impurity concentration than the low concentration region and the body layer. The low concentration region is in contact with the body layer from below, and is in contact with a gate insulating film on a side surface of the trench located below the body layer. The high concentration region is in contact with the low concentration region from below.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
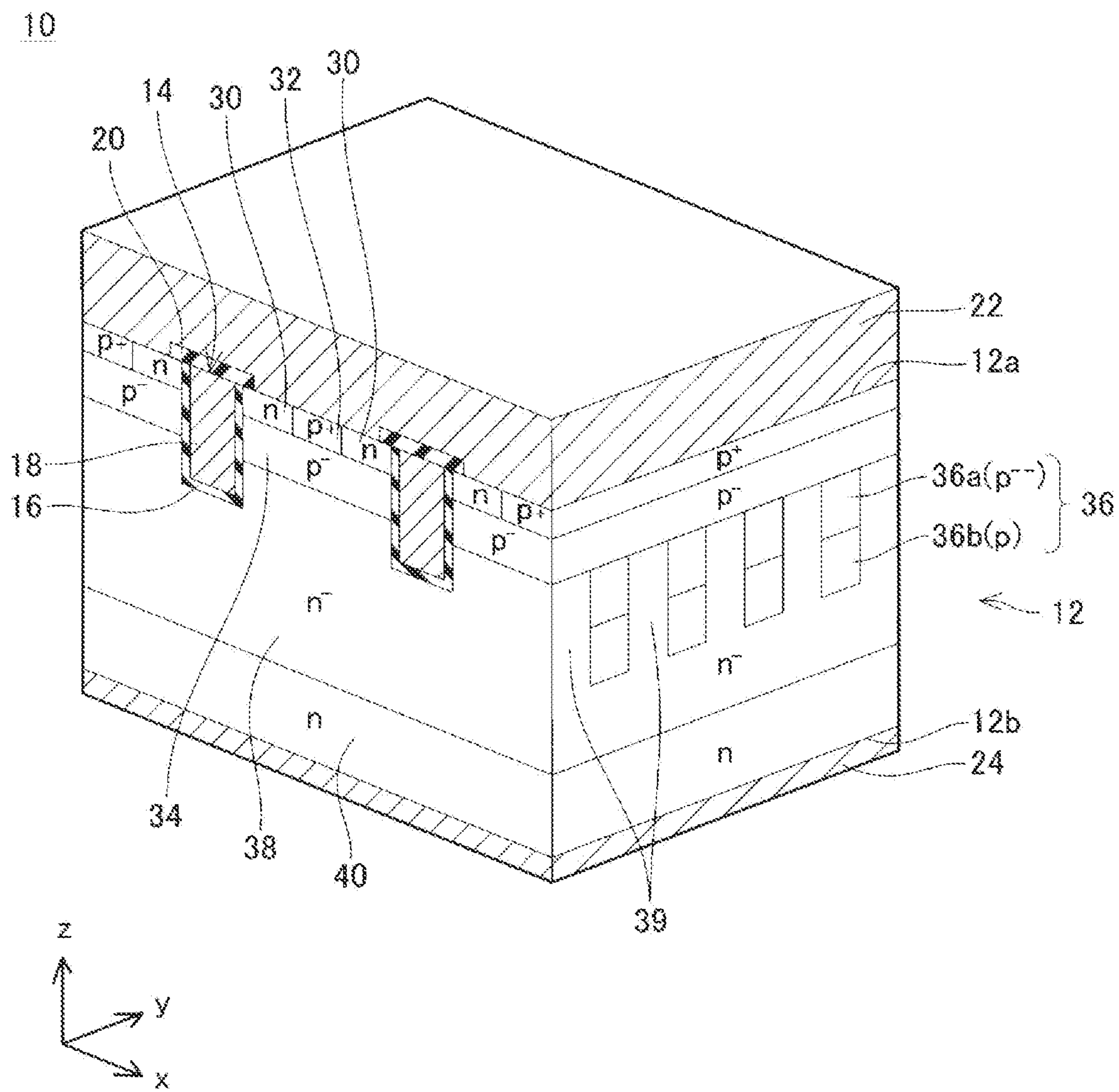
FIG. 1 is a cross-sectional perspective view of a metal-oxide-semiconductor field effect transistor (MOSFET) in an xz cross section not including p-type deep layers.

Next, a relevant technology is described only for understanding the following embodiments. A trench gate transistor according to the relevant technology includes a plurality of p-type deep layers protruding downward from a body layer. Each of the p-type deep layers extends so as to intersect trenches when a semiconductor substrate is viewed from above. Each of the p-type deep layers extends from the body layer to a position below a bottom surface of each of the trenches. Each of the p-type deep layers is in contact with a gate insulating film on a side surface of each of the trenches and the bottom surface of each of the trenches located below the body layer. Each of the p-type deep layers has a p-type impurity concentration higher than that of the body layer. The field effect transistor includes an n-type drift layer in contact with the body layer and each of the p-type deep layers. When the field effect transistor is turned off, a depletion layer spreads from the body layer into the drift layer. A source-drain voltage is held by the depletion layer extending into the drift layer. When the field effect transistor is turned off, a depletion layer also spreads from each of the p-type deep layers into the drift layer. Since each of the p-type deep layers is in contact with the gate insulating film on the bottom surface of each of the trenches, the drift layer in the vicinity of the bottom surface of each of the trenches is depleted by the depletion layer spreading from each of the p-type deep layers. In this manner, the depletion layer extending from each of the p-type deep layers to the vicinity of the bottom surface of each of the trenches restricts the occurrence of electric field concentration in the gate insulating film and the drift layer in the vicinity of the bottom surface of each of the trenches. Therefore, the above-described field effect transistor can have a higher breakdown voltage.

In the above field effect transistor, when a potential equal to or higher than a threshold value is applied to the gate electrode, a channel is formed in the body layer in the vicinity of the gate insulating film, and a source layer and the drift layer are connected by the channel. Therefore, electrons flow from the source layer to the drift layer through the channel. In a range in which the p-type deep layers are provided below the body layer, the p-type deep layers are in contact with the gate insulating film. Since the p-type deep layers have the higher p-type impurity concentration than the body layer, no channel is formed in the p-type deep layers. Therefore, electrons flowing in the channel formed in the body region flow toward the drift layer while avoiding the p-type deep layers. As described above, the above-described field effect transistor has an issue that the range in which the channel is formed is narrow and the channel resistance is high.

A field effect transistor according to an aspect of the present disclosure includes a semiconductor substrate, a trench, a gate insulating film, and a gate electrode. The semiconductor substrate has an upper surface. The trench is provided from the upper surface of the substrate. The gate insulating film covers an inner surface of the trench. The gate electrode is disposed inside the trench and is insulated from the semiconductor substrate by the gate insulating film. The semiconductor substrate includes a source layer of n-type, a body layer of p-type, a plurality of p-type deep layers, and a drift layer of n-type. The source layer is in contact with the gate insulating film on a side surface of the trench. The body layer is located below the source layer and is in contact with the gate insulating film on the side surface of the trench. The p-type deep layers protrude downward from the body layer, extend so as to intersect the trench when the semiconductor substrate is viewed from above, extend from the body layer to a position below a bottom surface of the trench, and are in contact with the gate insulating film on the side surface of the trench and the bottom surface of the trench located below the body layer. The drift layer is distributed over a spacing region between the p-type deep layers and a region below the p-type deep layers, and is in contact with a lower surface of each of the p-type deep layers. The drift layer in the spacing region is in contact with a lower surface of the body layer and a side surface of each of the p-type deep layers, and is in contact with the gate insulating film on the side surface of the trench and the bottom surface of the trench located below the body layer. Each of the p-type deep layers includes a low concentration region and a high concentration region. The high concentration region has a p-type impurity concentration higher than a p-type impurity concentration of the low concentration region and a p-type impurity concentration of the body layer. The low concentration region is in contact with the body layer from below, and is in contact with the gate insulating film on the side surface of the trench located below the body layer. The high concentration region is in contact with the low concentration region from below.

Each of the p-type deep layers of the field effect transistor has the low concentration region and the high concentration region. The high concentration region is disposed below the low concentration region (that is, a side close to the drift layer). Therefore, when the field effect transistor is turned off, the depletion layer spreads from the high concentration region to the drift layer. The vicinity of the bottom surface of the trench is depleted by the depletion layer extending from the high concentration region. Accordingly, the occurrence of electric field concentration in the gate insulating film and the drift layer in the vicinity of the bottom surface of the trench can be restricted. Therefore, the field effect transistor can have a higher breakdown voltage. The low concentration region is in contact with the gate insulating film below the body layer. Therefore, when the field effect transistor is turned on, a channel is formed not only in the body layer but also in the low concentration region (that is, a part of the p-type deep layer) having the low p-type impurity concentration. As described above, the channel is formed in the low concentration region, and thus the channel is widened. Therefore, the field effect transistor can have a low channel resistance. As described above, according to the above-described structure of the field effect transistor, it is possible to realize the low channel resistance by the low concentration region while realizing the high breakdown voltage by the p-type deep layers.

In an example of the present disclosure, in the field effect transistor, the low concentration region may be in contact with the gate insulating film on the bottom surface of the trench.

According to this configuration, since the channel is also formed on the bottom surface of the trench, the channel resistance can be further reduced.

In an example of the present disclosure, in the field effect transistor, a thickness of a portion of the low concentration region located below the trench may be 200 nm or more.

According to this configuration, even if an error occurs when forming the trench and the low concentration region, the low concentration region can be reliably formed below the trench.

In an example of the present disclosure, in the field effect transistor, the p-type impurity concentration of the low concentration region may be lower than the p-type impurity concentration of the body layer.

While the p-type impurity concentration of the body layer affects a gate threshold value, the p-type impurity concentration of the low concentration region hardly affects the gate threshold value. Therefore, no problem occurs even if the p-type impurity concentration of the low concentration region is lower than the p-type impurity concentration of the body layer. Furthermore, by setting the p-type impurity concentration of the low concentration region to be lower than the p-type impurity concentration of the body layer, the resistance of the channel formed in the low concentration region can be reduced.

In an example of the present disclosure, the p-type deep layers may be configured so that a non-depletion region remains in the low concentration region and the high concentration region and the body layer is connected by the non-depletion region when a maximum rated voltage is applied to the field effect transistor in an off state.

According to this configuration, each of the high concentration regions does not float in the off state. Therefore, when the field effect transistor is switched from the off state to the on state, the depletion layer extending from the high concentration region to the drift layer quickly reduces. Therefore, the field effect transistor can be turned on quickly.

Figure 2:
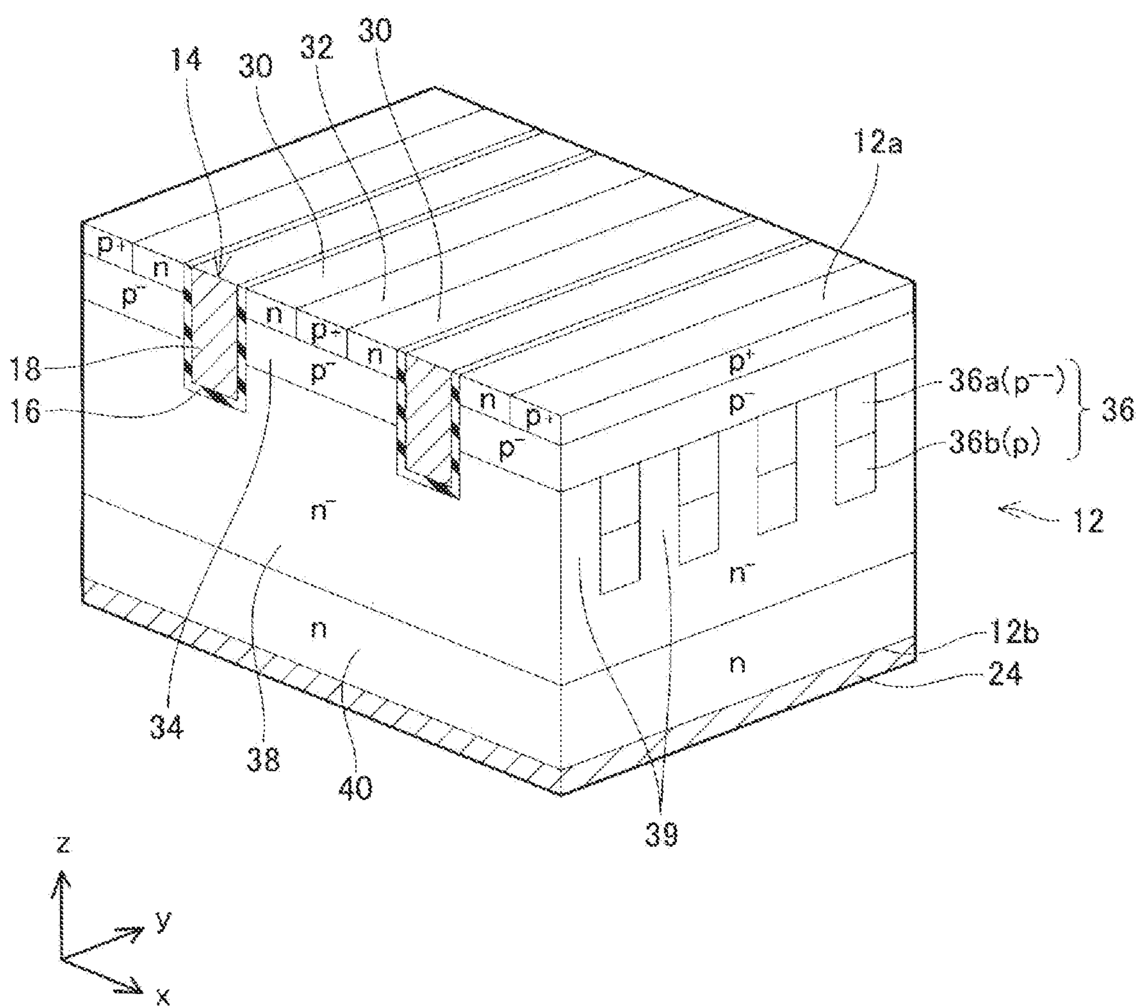
FIG. 2 is a cross-sectional perspective view of the MOSFET in which a source electrode and an interlayer insulating film are omitted.

FIG. 1 and FIG. 2 show a metal-oxide-semiconductor field effect transistor (MOSFET) 10 according to an embodiment. In the following, a direction parallel to an upper surface 12*a* of the semiconductor substrate 12 may also be referred to as an x-direction, a thickness direction of the semiconductor substrate 12 may also be referred to as a z-direction, and a direction perpendicular to the x-direction and the z-direction may also be referred to as a y-direction. The semiconductor substrate 12 is made of silicon carbide (SiC). However, the semiconductor substrate 12 may also be made of other material such as silicon or gallium nitride. A plurality of trenches 14 is provided from the upper surface 12*a* of the semiconductor substrate 12. As shown in FIG. 2, the trenches 14 extend in the y direction on the upper surface 12*a*. The trenches 14 are arranged at intervals in the x-direction.

As shown in FIG. 1 and FIG. 2, an inner surface (that is, a bottom surface and a side surface) of each of the trenches 14 is covered with a gate insulation film 16. A gate electrode 18 is disposed in each of the trenches 14. The gate electrode 18 is insulated from the semiconductor substrate 12 by the gate insulation film 16. As shown in FIG. 1, an upper surface of the gate electrode 18 is covered with an interlayer insulation film 20. A source electrode 22 is disposed on the semiconductor substrate 12. The source electrode 22 covers each of the interlayer insulation films 20. The source electrode 22 is insulated from the gate electrodes 18 by the interlayer insulation films 20. The source electrode 22 is in contact with the upper surface 12*a* of the semiconductor substrate 12 at portions where the interlayer insulation films 20 are not provided. A drain electrode 24 is disposed at a bottom of the semiconductor substrate 12. The drain electrode 24 is in contact with the entire region of a lower surface 12*b* of the semiconductor substrate 12.

As shown in FIG. 1 and FIG. 2, the semiconductor substrate 12 includes a plurality of source layers 30, a plurality of contact layers 32, a body layer 34, a plurality of p-type deep layers 36, a drift layer 38, and a drain layer 40.

Each of the source layers 30 is an n-type layer having a high n-type impurity concentration. Each of the source layers 30 is disposed in a range partially including the upper surface 12*a* of the semiconductor substrate 12. Each of the source layers 30 is in ohmic contact with the source electrode 22. Each of the source layers 30 is in contact with the gate insulating film 16 at an uppermost portion of the side surface of the trench 14. Each of the source layers 30 faces the gate electrode 18 with the gate insulating film 16 interposed therebetween. Each of the source layers 30 extends in the y direction along the side surface of the trench 14.

Each of the contact layers 32 is a p-type layer having a high p-type impurity concentration. Each of the contact layers 32 is disposed in a range partially including the upper surface 12*a* of the semiconductor substrate 12. Each of the contact layers 32 is disposed between two corresponding source layers 30. Each of the contact layers 32 is in ohmic contact with the source electrode 22. Each of the contact layers 32 extends in the y direction.

The body layer 34 is a p-type layer having a lower p-type impurity concentration than the contact layers 32. The body layer 34 is disposed below the source layers 30 and the contact layers 32. The body layer 34 is in contact with the source layers 30 and the contact layers 32 from below. The body layer 34 is in contact with the gate insulating film 16 on the side surface of the trench 14 located below the source layer 30. The body layer 34 faces the gate electrode 18 with the gate insulating film 16 interposed therebetween.

Figure 3:
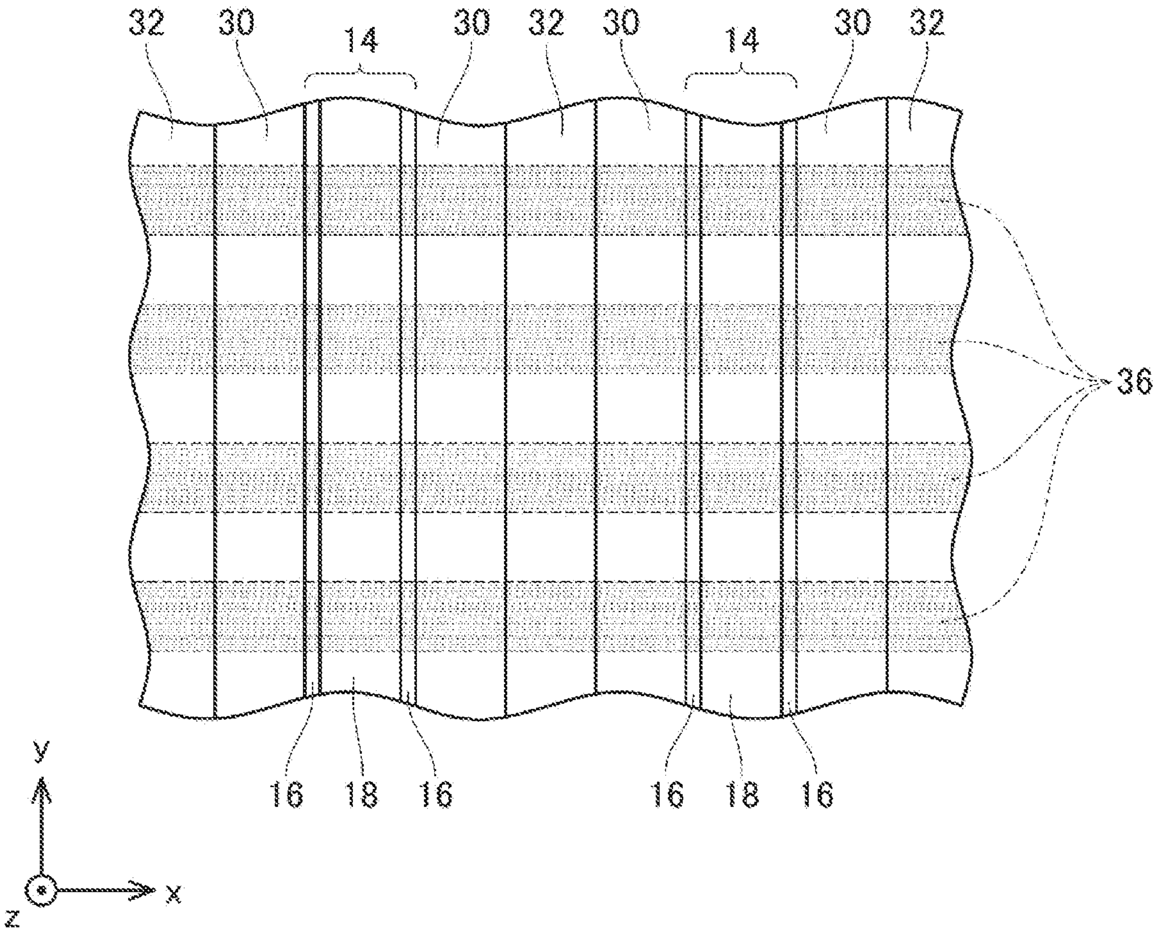
FIG. 3 is a plan view showing the arrangement of trenches and p-type deep layers when a semiconductor substrate is viewed from above.
Figure 4:
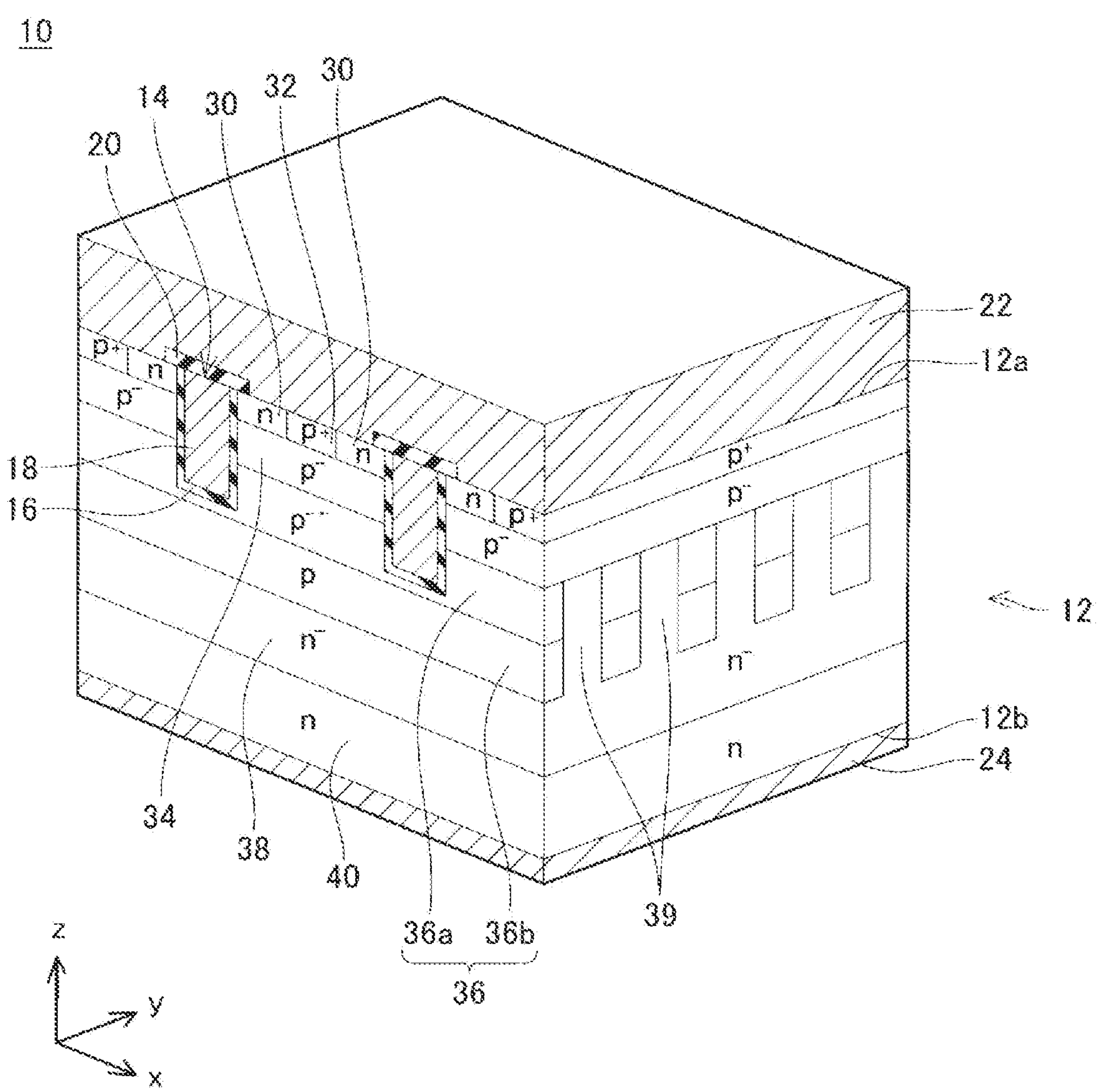
FIG. 4 is a cross-sectional perspective view of the MOSFET in an xz cross section including the p-type deep layers.

Each of the p-type deep layers 36 is a p-type layer protruding downward from the lower surface of the body layer 34. As shown in FIG. 3, when the semiconductor substrate 12 is viewed from above, each of the p-type deep layers 36 extends in the x direction and is orthogonal to the trenches 14. The p-type deep layers 36 are arranged at intervals in the y direction. As shown in FIG. 4, each of the p-type deep layer 36 extends from the lower surface of the body layer 34 to a position below the bottom surface of each of the trenches 14. Each of the p-type deep layers 36 is in contact with the gate insulating film 16 on the side surface of each of the trenches 14 located below the body layer 34. In addition, each of the p-type deep layers 36 is in contact with the gate insulating film 16 on the bottom surface of each of the trenches 14. Each of the p-type deep layers 36 faces the gate electrode 18 with the gate insulating film 16 interposed therebetween.

Each of the p-type deep layer 36 includes a low concentration region 36*a* and a high concentration region 36*b*. A p-type impurity concentration of each of the low concentration regions 36*a* is lower than the p-type impurity concentration of the body layer 34. A p-type impurity concentration of each of the high concentration regions 36*b* is higher than the p-type impurity concentration of the body layer 34. For example, the p-type impurity concentration of each of the high concentration regions 36*b* may be two times or more the p-type impurity concentration of each of the low concentration regions 36*a*.

Each of the low concentration regions 36*a* is in contact with the body layer 34 from below. Each of the low concentration regions 36*a* extends from the lower surface of the body layer 34 to a position below the bottom surface of each of the trenches 14. Each of the low concentration regions 36*a* is in contact with the gate insulating film 16 on the side surface of each of the trenches 14 located below the body layer 34. Each of the low concentration regions 36*a* is in contact with the gate insulating film 16 on the bottom surface of each of the trenches 14. Each of the low concentration regions 36*a* faces the gate electrode 18 with the gate insulating film 16 interposed therebetween. A thickness of a portion of each of the low concentration regions 36*a* located below each of the trench 14 is 200 nm or more.

Each of the high concentration regions 36*b* is in contact with corresponding one of the low concentration regions 36*a* from below. That is, the high concentration regions 36*b* and the body layer 34 are connected by the corresponding low concentration regions 36*a*. Each of the high concentration regions 36*b* is not in contact with the gate insulating film 16.

The drift layer 38 is an n-type layer having an n-type impurity concentration lower than that of the source layers 30. The drift layer 38 is disposed below the body layer 34 and the p-type deep layer 36. As shown in FIG. 1 and FIG. 2, the drift layer 38 is distributed over spacing regions 39 between the p-type deep layers 36 to a region below the p-type deep layers 36. The drift layer 38 is in contact with the lower surface of the body layer 34 in each of the spacing regions 39. The drift layer 38 is in contact with the side surface of each of the p-type deep layers 36 (that is, the side surface of each of the low concentration regions 36*a* and the side surface of each of the high concentration regions 36*b*) in the spacing regions 39. The drift layer 38 is in contact with the gate insulating film 16 in each of the spacing regions 39. That is, the drift layer 38 in each of the spacing regions 39 is in contact with the gate insulating film 16 at the side surface of the trench 14 and the bottom surface of the trench 14 located below the body layer 34. The drift layer 38 is in contact with a lower surface of each of the p-type deep layers 36 (that is, a lower surface of each of the high concentration regions 36*b*).

The drain layer 40 is an n-type layer having an n-type impurity concentration higher than that of the drift layer 38. The drain layer 40 is in contact with the drift layer 38 from below. The drain layer 40 is arranged in a region including the lower surface 12*b* of the semiconductor substrate 12. The drain layer 40 is in ohmic contact with the drain electrode 24.

When the MOSFET 10 is used, a higher potential is applied to the drain electrode 24 as compared to the source electrode 22. When a potential equal to or higher than a gate threshold value is applied to each of the gate electrodes 18, a channel is formed in the body layer 34 in the vicinity of the gate insulating film 16. The source layers 30 and the drift layer 38 are connected by the channel. Therefore, electrons flow from the source layers 30 to the drain layer 40 through the channel and the drift layer 38. That is, the MOSFET 10 is turned on. When the potential of each of the gate electrodes 18 is reduced from a value equal to or higher than the gate threshold value to a value less than the gate threshold value, the channel disappears and the flow of electrons stops. In other words, the MOSFET 10 is turned off.

Next, the operation when the MOSFET 10 is turned off will be described in more detail. When the channel disappears, a reverse voltage is applied to a pn junction at an interface between the body layer 34 and the drift layer 38. Therefore, a depletion layer spreads from the body layer 34 to the drift layer 38. Each of the p-type deep layers 36 is connected to the body layer 34 and has substantially the same potential as the body layer 34. Therefore, when the channel disappears, a reverse voltage is also applied to a pn junction at an interface between each of the p-type deep layers 36 and the drift layer 38. Therefore, a depletion layer spreads from each of the p-type deep layers 36 to the drift layer 38. In particular, since the high concentration region 36*b* constituting a lower portion of each of the p-type deep layers 36 has the high p type impurity concentration, the depletion layer quickly spreads in a wide range from each of the high concentration regions 36*b* to the drift layer 38. As shown in FIG. 4, the p-type deep layers 36 (in particular, the high concentration regions 36*b*) are present below the trenches 14 at intersections of the p-type deep layers 36 and the trenches 14. Therefore, the depletion layer quickly spreads from each of the high concentration regions 36*b* below the trenches 14 to the drift layer 38 in the vicinities of the bottom surfaces of the trenches 14 (that is, the drift layer 38 in the spacing regions 39). Accordingly, the electric field concentration in the vicinities of the bottom surfaces of the trenches 14 can be restricted. Furthermore, almost the entire drift layer 38 is depleted by the depletion layers spreading from the body layer 34 and each of the p-type deep layers 36 to the drift layer 38. The high voltage applied between the drain electrode 24 and the source electrode 22 is held by the drift layer 38 that is depleted.

Figure 5:
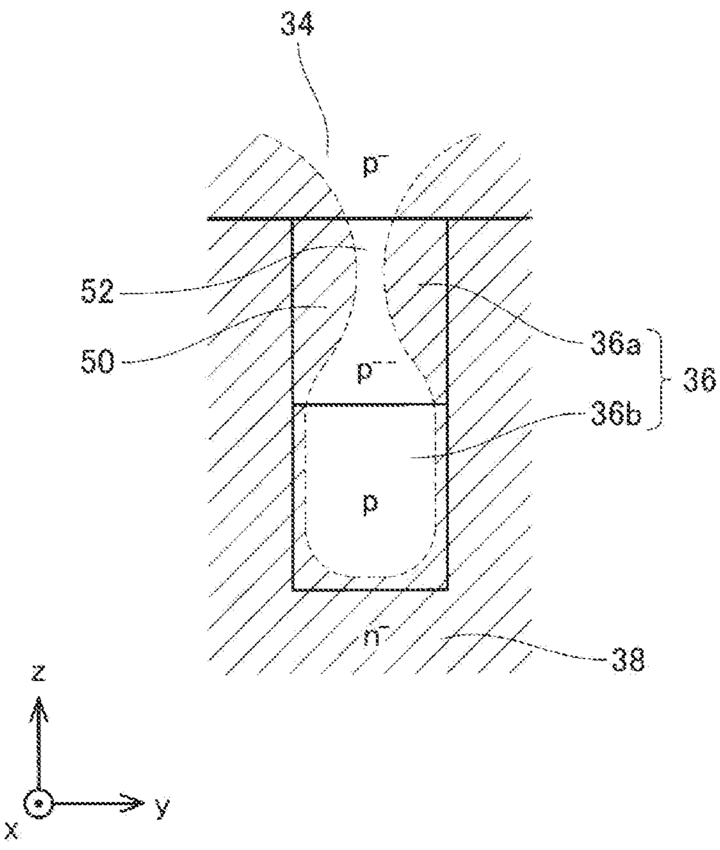
FIG. 5 is a sectional view showing the distribution of a depletion layer in a p-type deep layer when a maximum rated voltage is applied.

When the MOSFET 10 is turned off, the depletion layer spreads from each interface between each of the p-type deep layers 36 and the drift layer 38 into each of the p-type deep layers 36. FIG. 5 shows the distribution of the depletion layer in the p-type deep layer 36 when the MOSFET 10 is off. In FIG. 5, a hatched area is a depletion layer 50, and an unhatched area is a region that is not depleted (hereinafter, referred to as a non-depletion region 52). As shown in FIG. 5, the depletion layer 50 does not extend so much into the high concentration region 36*b* where the p-type impurity concentration is high, but extends widely into the low concentration region 36*a* where the p-type impurity concentration is low. Even when the maximum rated voltage is applied between the drain electrode 24 and the source electrode 22 in the MOSFET 10 that is in the off state, as shown in FIG. 5, a state in which the non-depletion region 52 remains in the low concentration region 36*a*, and the body layer 34 and the high concentration region 36*b* are connected by the non-depletion region 52 in the low concentration region 36*a* is maintained. Therefore, in the off state of the MOSFET 10, the high concentration region 36*b* does not float, and the potential of the high concentration region 36*b* is stable.

Next, the operation when the MOSFET 10 is turned on will be described in more detail. As described above, when the potential of the gate electrode 18 is increased to a value equal to or higher than the gate threshold value, the source layer 30 and the drift layer 38 are connected by the channel formed in the body layer 34. Then, the potential difference between the body layer 34 and the drift layer 38 decreases. Then, holes flow from the contact layer 32 into the body layer 34, and holes flow from the contact layer 32 into the high concentration region 36*b* through the body layer 34. When the holes flow into the body layer 34, the depletion layer extending from the body layer 34 to the drift layer 38 is reduced. When holes flow into the high concentration region 36*b*, the depletion layer extending from the high concentration region 36*b* to the drift layer 38 is reduced. By reducing the depletion layer extending to the drift layer 38 in this manner, the resistance of the drift layer 38 decreases. Therefore, electrons flow from the source layer 30 to the drain layer 40 through the channel and the drift layer 38. That is, the MOSFET 10 is turned on. Here, as described above with reference to FIG. 5, in a state where the MOSFET 10 is turned off, the high concentration region 36*b* and the body layer 34 are connected by the non-depletion region 52 in the low concentration region 36*a*. That is, in a state where the MOSFET 10 is off, the high concentration region 36*b* is not floating. Therefore, when the MOSFET 10 is turned on, holes easily flow into the high concentration region 36*b* from the body layer 34 through the non-depletion region 52 in the low concentration region 36*a*. Therefore, the depletion layer extending from the high concentration region 36*b* to the drift layer 38 is reduced in a short time, and an electron flow path is formed in the drift layer 38 in a short time. Therefore, the turn-on speed of the MOSFET 10 is high.

Figure 6:
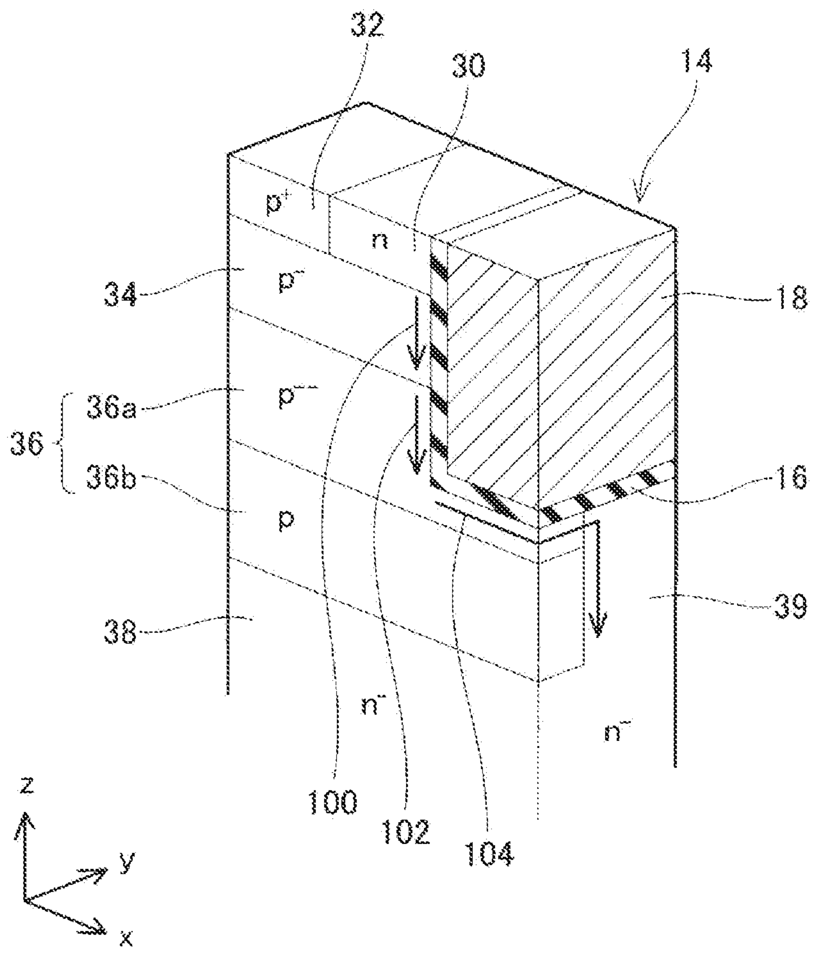
FIG. 6 is a cross-sectional perspective view of an intersection of a trench and a p-type deep layer.

As described above, when the potential of the gate electrode 18 is increased to a value equal to or higher than the gate threshold value, the channel is formed in the body layer 34. In the MOSFET 10 of the present embodiment, the low concentration region 36*a* has the low p-type impurity concentration. The low concentration region 36*a* is in contact with the gate insulating film 16. Therefore, the channel is also formed in a region of the low concentration region 36*a* in contact with the gate insulating film 16. In this manner, since the channel is formed not only in the body layer 34 but also in the low concentration region 36*a*, the channel is wide. Therefore, the channel resistance of the MOSFET 10 is low. In particular, the low concentration region 36*a* is in contact with the gate insulating film 16 not only on the side surface of the trench 14 but also on the bottom surface of the trench 14. Therefore, in the low concentration region 36*a*, the channel is formed not only in a range along the side surface of the trench 14 but also in a range along the bottom surface of the trench 14. When the channel is formed in the low concentration region 36*a* as described above, electrons flow at the intersection of the trench 14 and the p-type deep layer 36 as shown in FIG. 6. That is, in the body layer 34, as indicated by an arrow 100, electrons flow downward along the channel formed on the side surface of the trench 14. The electrons flowing into the low concentration region 36*a* flow downward in the low concentration region 36*a* along the channel formed on the side surface of the trench 14 as indicated by an arrow 102. The electrons reaching a lower end of the trench 14 in the low concentration region 36*a* flow in the y direction along the channel formed in the bottom surface of the trench 14 and flow to the drift layer 38 in the spacing region 39 as indicated by an arrow 104. As described above, according to the structure of the MOSFET 10, since the channel is formed along the bottom surface of the trench 14, the path through which electrons flow is enlarged, and the channel resistance can be effectively reduced.

In the MOSFET 10, the p-type impurity concentration of the low concentration region 36*a* is lower than the p-type impurity concentration of the body layer 34. The p-type impurity concentration of the body layer 34 has a correlation with the gate threshold value of the MOSFET 10. Therefore, it is difficult to reduce the p-type impurity concentration of the body layer 34 to a predetermined value or more. On the other hand, since the p-type impurity concentration of the low-concentration region 36*a* has almost no influence on the gate threshold value of the MOSFET 10, no problem occurs even if the p-type impurity concentration of the low-concentration region 36*a* is made lower than the p-type impurity concentration of the body layer 34. When the p-type impurity concentration of the low concentration region 36*a* is lower than the p-type impurity concentration of the body layer 34, the resistance of the channel formed in the low concentration region 36*a* is lower than the resistance of the channel formed in the body layer 34. Therefore, the channel resistance of the entire MOSFET 10 can be further reduced.

As described above, according to the structure of the MOSFET 10 of the present embodiment, it is possible to realize a high breakdown voltage and a low channel resistance. The results of measuring the characteristics of the MOSFET 10 of the present embodiment and a MOSFET of a comparative example will be described. Note that, in the MOSFET of the comparative example, the entire p-type deep layers 36 have the same p-type impurity concentration as that of the high concentration regions 36*b*. In both the MOSFET 10 of the present embodiment and the MOSFET of the comparative example, the drain-source breakdown voltage was about 1100 V. The MOSFET 10 of the present embodiment had an on-resistance of about 1.00 mΩcm$^2$, whereas the MOSFET of the comparative example had an on-resistance of about 1.10 mΩcm$^2$. From this result, it was found that the channel resistance of the MOSFET 10 of the embodiment was reduced by about 50% as compared with the MOSFET of the comparative example. As described above, according to the structure of the MOSFET 10 of the present embodiment, the channel resistance can be reduced more than that of the MOSFET of the comparative example while maintaining a high breakdown voltage equivalent to that of the MOSFET of the comparative example.

As described above, in the MOSFET 10 of the present embodiment, the thickness of the portion of the low concentration region 36*a* located below the trench 14 is 200 nm or more. Due to an error in forming the low concentration region 36*a* and an error in forming the trench 14, the thickness of the low concentration region 36*a* below the trench 14 may vary by about −200 nm to +200 nm. Therefore, by setting the thickness of the portion of the low concentration region 36*a* located below the trench 14 to be 200 nm or more, the low concentration region 36*a* can be reliably formed below the trench 14 even when a manufacturing error occurs.

In the above-described embodiment, the p-type impurity concentration of the low concentration region 36*a* is lower than the p-type impurity concentration of the body layer 34. However, the p-type impurity concentration of the low concentration region 36*a* may be higher than the p-type impurity concentration of the body layer 34 as long as it is lower than the p-type impurity concentration of the high concentration region 36*b*. Even if the p-type impurity concentration of the low concentration region 36*a* is higher than the p-type impurity concentration of the body layer 34, the channel resistance can be reduced if a channel is formed in the low concentration region 36*a*.

Figure 7:
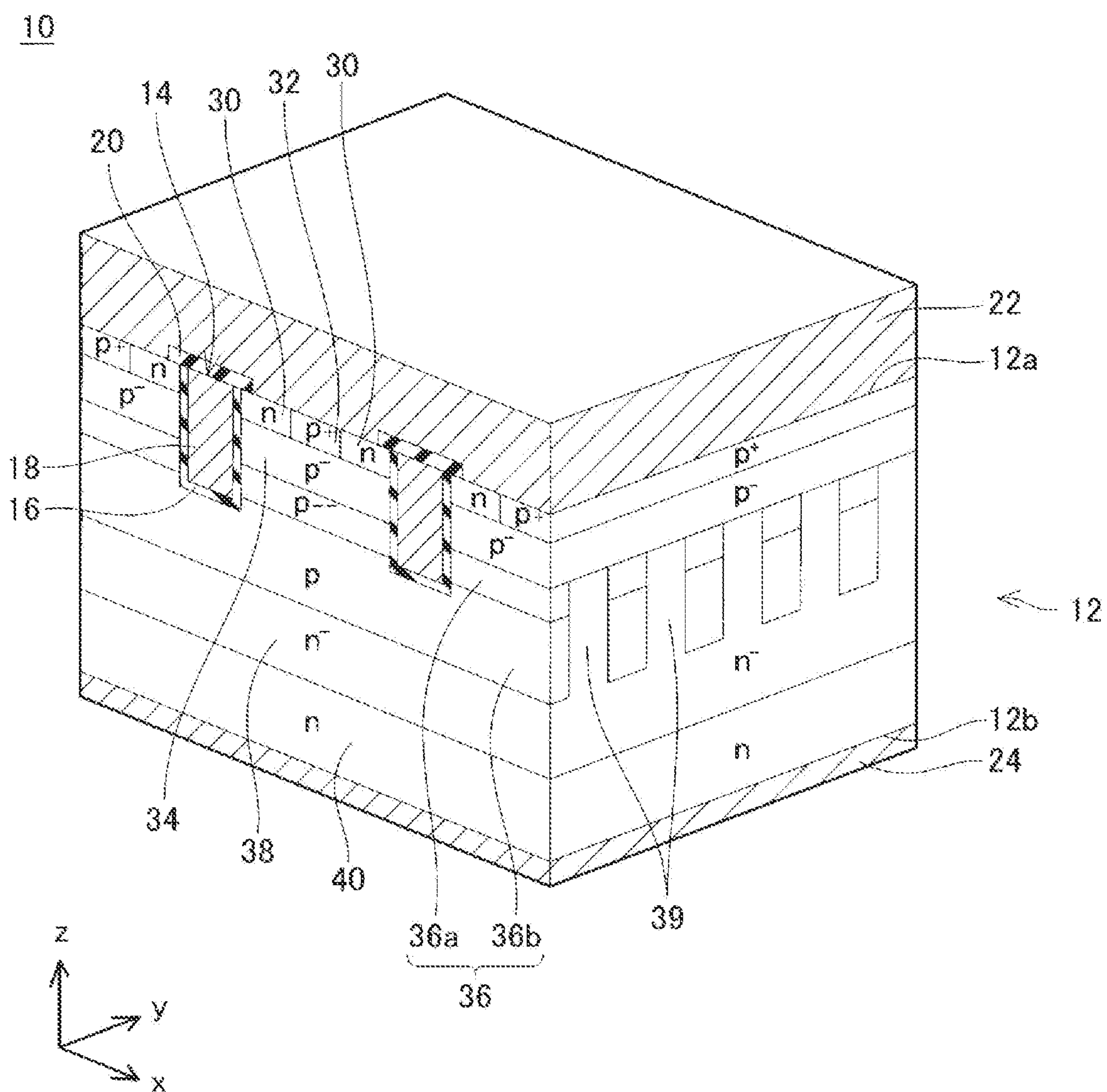
FIG. 7 is a cross-sectional perspective view of a MOSFET according to a modification in an xz cross section including p-type deep layers.

Furthermore, in the above-described embodiment, the low concentration region 36*a* extends from the lower surface of the body layer 34 to a position below the bottom surface of the trench 14. However, as shown in FIG. 7, the lower end of the low concentration region 36*a* may be positioned above the bottom surface of the trench 14. In this configuration, since the high concentration region 36*b* is in contact with the bottom surface of the trench 14, no channel is formed on the bottom surface of the trench 14. However, even in this configuration, a channel is formed in a range of the low concentration region 36*a* adjacent to the side surface of the trench 14. Therefore, the channel can be enlarged as compared with the MOSFET of the comparative example, and the channel resistance can be reduced.

Furthermore, in the above-described embodiment, each of the p-type deep layers 36 is orthogonal to each of the trenches 14. However, each of the p-type deep layers 36 may obliquely intersect each of the trenches 14.

Although the embodiments have been described in detail above, these are merely examples and do not limit the scope of claims. The techniques described in the claims include various modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A field effect transistor comprising:
a semiconductor substrate having an upper surface;
a trench provided from the upper surface of the substrate;
a gate insulating film covering an inner surface of the trench; and
a gate electrode disposed inside the trench and being insulated from the semiconductor substrate by the gate insulating film,
wherein
the semiconductor substrate includes:
a source layer of n-type being in contact with the gate insulating film on a side surface of the trench;
a body layer of p-type located below the source layer and being in contact with the gate insulating film on the side surface of the trench;
a plurality of p-type deep layers protruding downward from the body layer, extending so as to intersect the trench when the semiconductor substrate is viewed from above, extending from the body layer to a position below a bottom surface of the trench, and being in contact with the gate insulating film on the side surface of the trench and the bottom surface of the trench located below the body layer; and
a drift layer of n-type distributed over a spacing region between the plurality of p-type deep layers and a region below the plurality of p-type deep layers, and being in contact with a lower surface of each of the plurality of p-type deep layers,
the drift layer in the spacing region is in contact with a lower surface of the body layer and a side surface of each of the plurality of p-type deep layers, and is in contact with the gate insulating film on the side surface of the trench and the bottom surface of the trench located below the body layer,
each of the plurality of p-type deep layers includes a low concentration region and a high concentration region,
the high concentration region has a p-type impurity concentration higher than a p-type impurity concentration of the low concentration region and a p-type impurity concentration of the body layer,
the low concentration region is in contact with the body layer from below, and is in contact with the gate insulating film on the side surface of the trench located below the body layer,
the high concentration regions in contact with the low concentration region from below,
the plurality of p-type deep layers is configured so that a non-depletion region remains in the low concentration region and the high concentration region and the body layer are connected by the non-depletion region when a maximum rated voltage is applied to the field effect transistor in an off state, and
the plurality of p-type deep layers is configured so that the non-depletion region extends from the body layer to the high concentration region through the low concentration region and the high concentration region does not float when the field effect transistor is in the off state.

2. The field effect transistor according to claim 1, wherein
the low concentration region is in contact with the gate insulating film on the bottom surface of the trench.

3. The field effect transistor according to claim 2, wherein
a thickness of a portion of the low concentration region located below the trench is 200 nm or more.

* * * * *